US009190994B2

(12) United States Patent
Hurwitz

(10) Patent No.: US 9,190,994 B2
(45) Date of Patent: Nov. 17, 2015

(54) RF SWITCH BRANCH HAVING IMPROVED LINEARITY

(71) Applicant: Newport Fab, LLC, Newport Beach, CA (US)

(72) Inventor: Paul D. Hurwitz, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 13/952,513

(22) Filed: Jul. 26, 2013

(65) Prior Publication Data

US 2014/0062575 A1 Mar. 6, 2014

Related U.S. Application Data

(60) Provisional application No. 61/694,674, filed on Aug. 29, 2012.

(51) Int. Cl.
H03K 17/687 (2006.01)
H01P 1/10 (2006.01)
H03K 17/16 (2006.01)

(52) U.S. Cl.
CPC ...... *H03K 17/161* (2013.01); *H03K 2217/0054* (2013.01)

(58) Field of Classification Search
CPC ............ H03K 17/161; H03K 2217/0054
USPC ............... 327/434, 436–437; 333/103
See application file for complete search history.

(56) References Cited

U.S. PATENT DOCUMENTS

| 6,094,088 | A * | 7/2000 | Yano | 327/534 |
| 6,154,085 | A * | 11/2000 | Ramakrishnan | 327/404 |
| 6,335,653 | B1 * | 1/2002 | Shigehara et al. | 327/534 |
| 7,667,525 | B2 * | 2/2010 | Grimone, III | 327/427 |
| 7,728,649 | B1 * | 6/2010 | Webb et al. | 327/534 |
| 8,058,922 | B2 * | 11/2011 | Cassia | 327/534 |
| 8,103,221 | B2 * | 1/2012 | Ta et al. | 455/81 |
| 8,289,066 | B2 * | 10/2012 | Guo | 327/427 |

* cited by examiner

*Primary Examiner* — Kenneth B Wells
(74) *Attorney, Agent, or Firm* — Farjami & Farjami LLP

(57) ABSTRACT

Disclosed is a radio frequency (RF) switch branch having a reduced nonlinearity and an associated method for reducing nonlinearity in a RF switch branch. The RF switch branch includes a primary transistor, a first transistor having power terminals electrically connected between a drain node and a body node of the primary transistor, and a second transistor having power terminals electrically connected between the body node and a source node of the primary transistor. The RF switch may further include a body resistor electrically connected between the body node of the primary transistor and ground, and a gate resistor electrically connected between a gate of the primary transistor and a gate voltage source. A gate of each of the first transistor and the second transistor is electrically connected to the gate voltage source such that the first transistor and the second transistor are ON only when the primary transistor is ON.

20 Claims, 4 Drawing Sheets

(Prior Art)

RF SWITCH BRANCH HAVING IMPROVED LINEARITY

The present application claims the benefit of and priority to a provisional patent application entitled "Radio Frequency Switch Branch Having Improved Linearity," Ser. No. 61/694,674 filed on Aug. 29, 2012. The disclosure in this provisional application is hereby incorporated fully by reference into the present application.

BACKGROUND

As semiconductor technologies advance, radio frequency (RF) applications require increasing standards of linearity in the transmission and amplification of high frequency signals. For example, applications such as RF switching, attenuation and antenna tuning require switch branches capable of transmitting high-power RF signals in the 0.5 GHz to 6 GHz range with a high degree of linearity. To accommodate high power levels, conventional approaches include stacking several low voltage NMOS transistors drain-to-source while isolating the gate and body nodes of each of the transistors using high value resistors.

However, in practice, isolation of the body node in silicon-on-insulator (SOI) technologies is challenging due to the formation of a parasitic conduction layer (PCL) at the interface between the base oxide layer and the substrate. Such a PCL may be neutralized by employing expensive manufacturing techniques such as polysilicon passivated substrates. However, even with such manufacturing techniques, further improvement in switch branch linearity will result in better end-system performance.

SUMMARY

The present disclosure is directed to an RF switch branch having improved linearity, substantially as shown in and/or described in connection with at least one of the figures, and as set forth more completely in the claims.

DETAILED DESCRIPTION

Figure 1A:
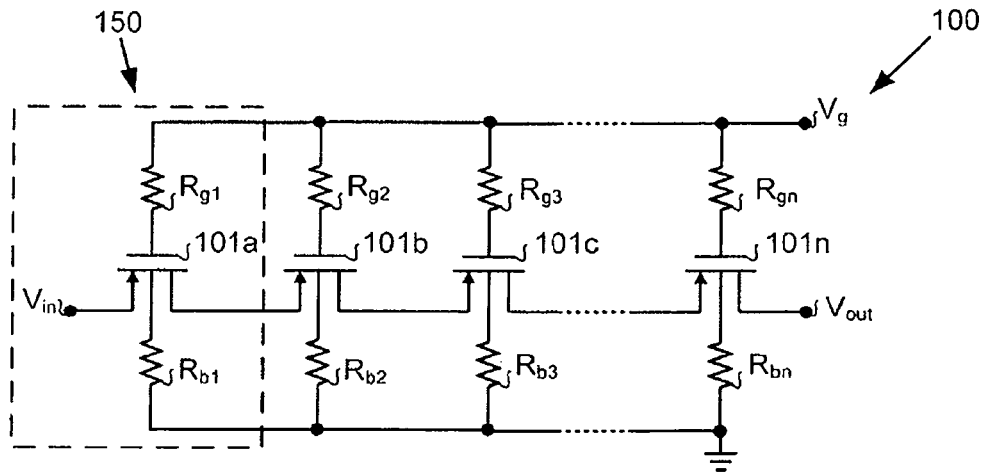
FIG. 1A illustrates an exemplary diagram of a conventional stacked switch branch.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

The present application utilizes a relatively small MOS device inserted between the source and body of a transistor, and another relatively small MOS device inserted between the body and drain of the transistor to reduce the AC impedance from the source or drain to the body of the transistor. This reduction in AC impedance may allow the transistor's body node voltage to more closely track the midpoint between the drain voltage and the source voltage, improving input/output symmetry and, accordingly, the linearity of the transistor.

A high degree of linearity is important because nonlinearity in the amplification or transfer of a signal will cause harmonic distortion. Which harmonics are produced depends on the transfer function of the circuit. For example, if the transfer function is even, the output signal will consist of only even harmonics of a sine wave applied to the input of the filter. Since the fundamental frequency is the first odd harmonic, it will not be present at the output of a filter having an even transfer function. Thus, where transfer of the original signal is required, an even transfer function is inappropriate. However, if the transfer function is odd, the resulting signal will include substantially only odd harmonics of the input signal, i.e., 1f, 3f, 5f, etc. Consequently, an odd transfer function also beneficially filters even harmonics from the output signal. Accordingly, the present application discloses a method for reducing nonlinearity in an RF switch branch by ensuring that a body node of each switch within the branch is continuously biased to the median voltage between the input voltage and the output voltage of that switch during operation.

FIG. 1A illustrates an exemplary diagram of a conventional stacked switch branch. For example, switch branch 100 may include several primary transistors 101a, 101b, 101c, and 101n, (101a through 101n) where "n" denotes the last, n$^{th}$ element of a series of similar elements. Each of primary transistors 101a through 101n may comprise CMOS FET transistors. However, each of primary transistors 101a through 101n may be any other appropriate type of transistor. Each of primary transistors 101a through 101n are connected source-to-drain such that the drain of primary transistor 101a serves as a voltage input $V_{in}$ and the source of primary transistor 101n serves as a voltage output $V_{out}$ of switch branch 100. One terminal of each of high value gate resistors $R_{g1}$, $R_{g2}$, $R_{g3}$ and $R_{gn}$ ($R_{g1}$ through $R_{gn}$) may be connected to the gate of primary transistors 101a through 101n, respectively, while the other terminal of each resistor $R_{g1}$ through $R_{gn}$ is connected to a common gate control voltage source, $V_g$. Likewise, one terminal of each of high value body resistors $R_{b1}$, $R_{b2}$, $R_{b3}$ and $R_{bn}$ ($R_{b1}$ through $R_{bn}$) may be connected to the body of primary transistors 101a through 101n, respectively, while the other terminal of each body resistor $R_{b1}$ through $R_{bn}$ is connected to a common bias voltage source, typically ground. Commonly biasing the gate of each of primary transistors 101a through 101n ensures each transistor is similarly controlled to either pass a signal or to block the signal. Relatively biasing the body of each of primary transistors 101a through 101n ensures the body of each primary transistor is similarly biased with respect to its own source and drain terminals. By stacking multiple matched transistors source-to-drain, higher total voltages may be controlled due to even distribution of the total voltage over each of the transistors during voltage blocking. A closer look at a single switch 150 within the conventional stacked switch branch is shown in greater detail in FIG. 1B.

Figure 1B:
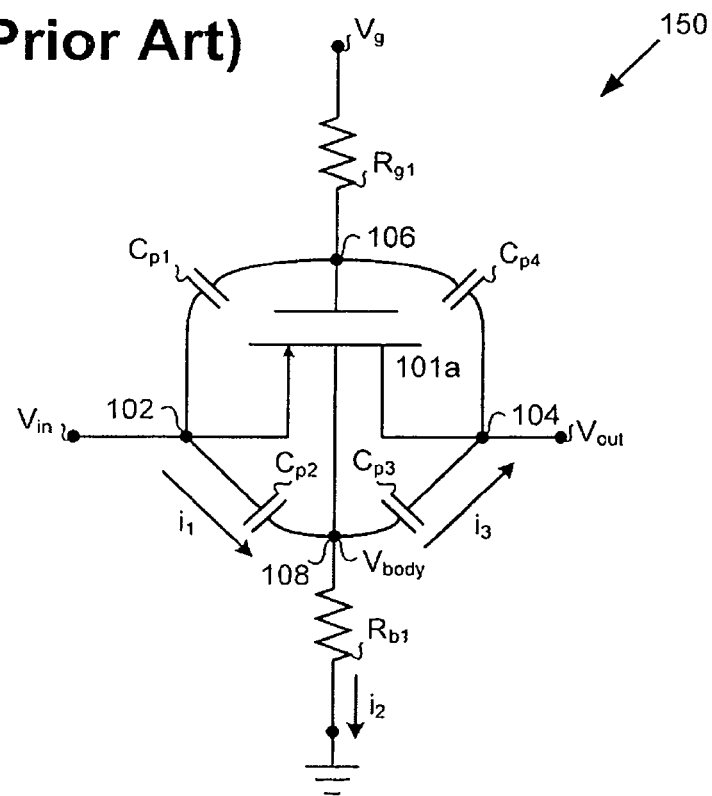
FIG. 1B illustrates an exemplary diagram of a single switch within a conventional stacked switch branch.

FIG. 1B illustrates an exemplary diagram of a single switch within a conventional stacked switch branch. For example, switch 150 may include primary transistor 101a, where gate control voltage $V_g$ is connected to the gate through $R_{g1}$ and the body is connected to ground through $R_{b1}$. For the purpose of explaining the operation of switch 150, the drain is connected to $V_{in}$ and the source is connected to $V_{out}$. Thus, drain node 102 (or "input node" 102) may be an input node, source node 104 (or "output node" 104) may be an output node, gate node 106 may be a gate node, and body node 108 may be a body node of primary transistor 101a.

In addition, parasitic capacitances exist between the nodes of primary transistor 101a. For example, $C_{p1}$ may represent the parasitic capacitance between input node 102 and gate node 106. $C_{p2}$ may represent the parasitic capacitance between input node 102 and body node 108. $C_{p3}$ may represent the parasitic capacitance between body node 108 and output node 104. $C_{p4}$ may represent the parasitic capacitance between output node 104 and gate node 106. $C_{p2}$ and $C_{p3}$ communicatively couple body node 108 with input node 102 and output node 104, respectively.

In operation, $C_{p2}$ and $C_{p3}$ divide the voltage difference between $V_{in}$ and $V_{out}$, such that $V_{body}$ appears at body node 108. However, to achieve a symmetrical voltage division, $V_{body}$ must be substantially equal to the midpoint between $V_{in}$ and $V_{out}$ when primary transistor 101a is conducting. To approximately achieve:

$$V_{body} = \frac{V_{in} + V_{out}}{2}$$

$R_{b1}$ must have a resistance considerably larger than the parasitic impedance of $C_{p2}$ and $C_{p3}$. This may be illustrated by a simple application of Kirchoff's Current Law, which states that the sum of currents flowing into a node is equal to the sum of currents flowing out of that node.

In FIG. 1B, the current flowing into body node 108 at a particular instant may be $i_1$, through $C_{p2}$, while the current flowing out of body node 108 at that instant may be the sum of $i_2$, through $R_{b1}$, and $i_3$, through $C_{p3}$. Thus, $i_1=i_2+i_3$. Assuming $C_{p2}$ and $C_{p3}$ have substantially equal capacitances, $V_{body}$ will only track the median between $V_{in}$ and $V_{out}$ if $i_1$ is substantially equal to $i_3$ and $i_2$ is substantially equal to zero. However, $i_2$ being substantially equal to zero requires the resistance of $R_{b1}$ to be considerably larger than the impedance of $C_{p2}$ and $C_{p3}$. If not, a non-negligible current $i_2$ will flow through $R_{b1}$, reducing the isolation of body node 108, and result in $V_{body}$ tracking an asymmetrical value not equal to the midpoint between $V_{in}$ and $V_{out}$. This asymmetry will express itself as nonlinearity in the transfer function of primary transistor 101a and will result in multiple higher-order harmonics of $V_{in}$ being expressed at $V_{out}$. If multiple RF channels are closely spaced, the higher-order harmonics may bleed into adjacent channels, increasing RF interference.

Figure 2:
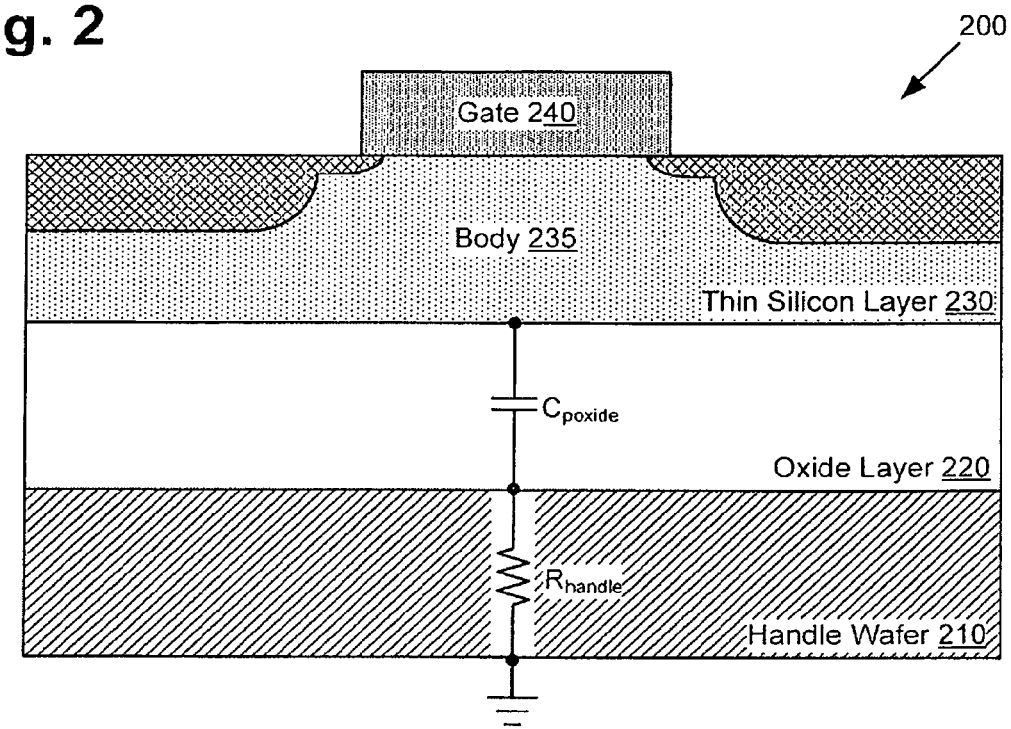
FIG. 2 illustrates an exemplary cross-sectional fabrication-level view of a switch within a conventional stacked switch branch.

However, in practice, SOI technologies make it difficult to achieve a high impedance body node because parasitic impedance paths through the SOI substrate reduce the effective body resistance. FIG. 2 illustrates an exemplary cross-sectional fabrication-level view of a switch within a conventional stacked switch branch. Switch 200 may correspond to a cross-sectional fabrication-level view of switch 150 of FIG. 1B above. The cross-sectional view of fabricated switch 200 may include thin silicon layer 230, disposed on oxide layer 220, which is disposed on handle wafer 210. Body 235 of primary transistor 101a may be formed in thin silicon layer 230, and gate 240 may be disposed over thin silicon layer 230. In operation, oxide layer 220 forms a parasitic capacitance $C_{poxide}$ between body 235 and handle wafer 210. In addition, handle wafer 210 has a parasitic resistance $R_{handle}$ between the oxide/handle wafer interface and the backside of handle wafer 210, on which a ground plane is typically formed. The series path from body 235 through $C_{poxide}$ and $R_{handle}$ presents a parasitic impedance which allows a parasitic current to flow from body 235 to ground, reducing the effective resistance and reducing the isolation of the body. Consequently, nonlinearity is introduced into the operation of the conventional switch branch.

Figure 3A:
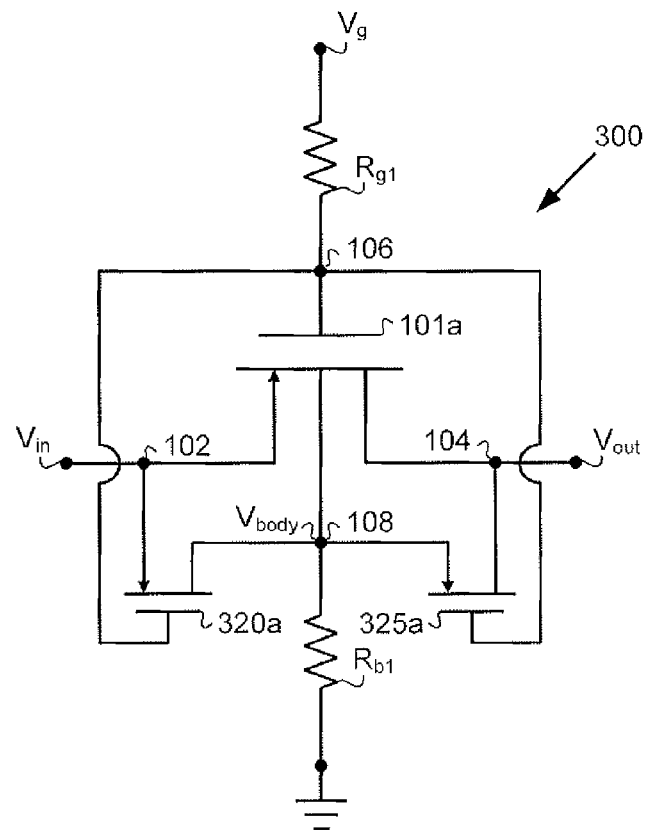
FIG. 3A illustrates an exemplary diagram of a single switch within a stacked switch branch, according to one implementation of the present application.

Because it is very difficult to achieve a sufficiently high body resistance to appropriately isolate the body of the transistor, the present inventive concepts provide a method by which the body node may be continually biased to a median voltage between the source and drain to provide a high degree of electrical isolation. FIG. 3A illustrates an exemplary diagram of a single switch within a stacked switch branch, according to one implementation of the present application. For example, switch 300 may include primary transistor 101a, which may have a very large channel width, for example 4 mm. Gate control voltage $V_g$ may provide a gate voltage source and may be connected to the gate through $R_{g1}$ and the body may be connected to ground through $R_{b1}$. Similar to FIG. 1B, the drain may be connected to $V_{in}$ and the source may be connected to $V_{out}$. Thus, switch 300 may include input node 102, output node 104, gate node 106, and body node 108. The parasitic capacitances $C_{p1}$ through $C_{p4}$ described above regarding FIG. 1B are similarly present in FIG. 3A, but are not shown. Each of primary transistors 101a through 101n are preferably field effect transistors (FETs). However, the present application is not so limited, and each of primary transistors 101a through 101n may be any other type of suitable transistor.

However, in contrast to FIG. 1B, the power terminals of a first small transistor 320a may be connected between input node 102 and body node 108, while the power terminals of a second small transistor 325a may be connected between body node 108 and output node 104. The gates of small transistors 320a and 325a may be commonly connected to gate node 106 such that each of small transistors 320a and 325a are ON only when primary transistor 101a is ON. Thus, when primary transistor 101a is ON, the gate drive voltage to each of the transistors is HIGH, providing a very low impedance path from input node 102 to body node 108, and from body node 108 to output node 104. Because the ON impedance of transistors 320a and 325a is much smaller than the impedance of parasitic capacitances $C_{p2}$ and $C_{p3}$, respectively, body node 104 is able to quickly track the median voltage between input node 102 and output node 104 when switch 300 is ON. Because voltage symmetry is preserved about body node 108 with respect to nodes 102 and 104, the transfer function of switch 300 may be an odd transfer function when switch 300 is ON. As discussed above, linearity may be greatly improved by substantially attenuating or eliminating all even-order harmonics of the input signal $V_{in}$ from the output signal $V_{out}$.

In addition, the application of small transistors 320a and 325a to switch 300 may only negligibly increase the area of single switch 300. For example, each of small transistors 320a and 325a are, preferably, approximately 1% the size of primary transistor 101a. Thus, the addition of small transistors 320a and 325a may only increase required area by approximately 2%.

Accordingly, the present inventive concepts do not directly increase the body node-to-ground impedance of primary transistor 101a. Instead the use of small transistors 320a and 325a increases the ratio of the body-to-ground impedance and either the source-to-body impedance or drain-to-body impedance. The increased impedance ratios effectively increase body node 108 isolation, allowing body node 108 to more closely track the median voltage between $V_{in}$ and $V_{out}$ when switch 300 is conducting.

Figure 3B:
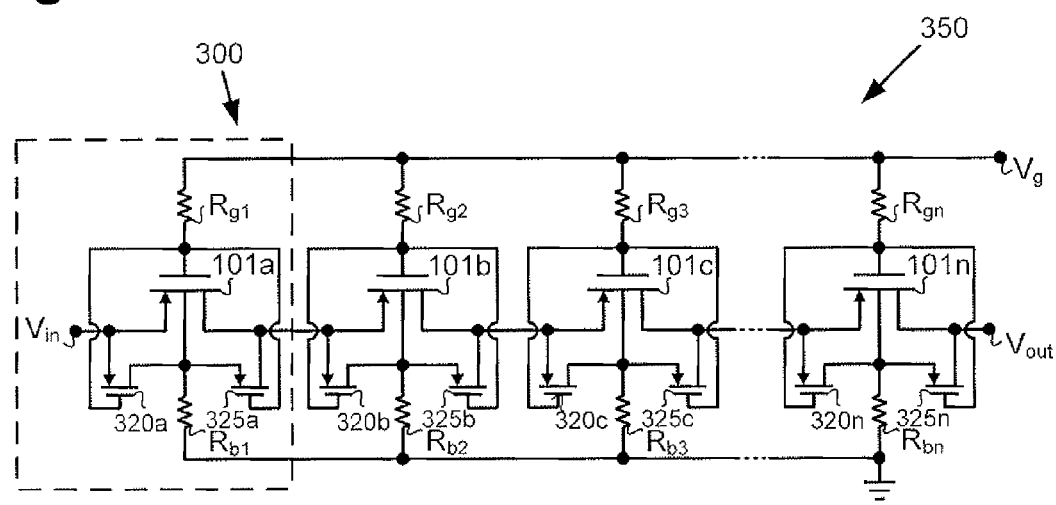
FIG. 3B illustrates an exemplary diagram of a stacked switch branch, according to one implementation of the present application.

As stated above, the total voltage controlled may be increased by stacking multiple switches in a stacked switch branch. Accordingly, FIG. 3B illustrates an exemplary diagram of a stacked switch branch, in accordance with one implementation of the present application. Stacked switch branch 350 may include several single switches connected in series. For example, switch 300 of FIG. 3A is shown within the dotted box shown in FIG. 3B. Thus, FIG. 3B may show the present inventive concepts of FIG. 3A, as applied to the switch branch 100 of FIG. 1A.

For example, stacked switch branch 350 may include "n" primary transistors, 101a through 101n. Each of primary transistors 101a through 101n are connected source-to-drain such that the drain of transistor 101a serves as a voltage input $V_n$, and the source of primary transistor 101n serves as a voltage output $V_{out}$ of stacked switch branch 350 (also referred to simply as the "output of the RF switch branch" in the present application). One terminal of each of high value resistors $R_{g1}$ through $R_{gn}$ may be connected to the gate of primary transistors 101a through 101n, respectively, while the other terminal of each resistor $R_{g1}$ through $R_{gn}$ is connected to a common gate control voltage, $V_g$. Likewise, one terminal of each of high value resistors $R_{b1}$ through $R_{bn}$ may be connected to the body of primary transistors 101a through 101n, respectively, while the other terminal of each of resistor $R_{b1}$ through $R_{bn}$ is connected to a common bias voltage, typically ground. Each of $R_{g1}$ through $R_{gn}$ and $R_{b1}$ through $R_{bn}$ may be made of polysilicon or any other appropriate material and may have a value of several tens of thousands of ohms, for example, 50 kΩ or greater. By stacking multiple transistors source-to-drain, higher total voltages may be controlled due to the voltage being distributed evenly over each of primary transistors 101a through 101n during blocking. As in FIG. 3A, each of primary transistors 101a through 101n may have a small transistor 320a through 320n, respectively, connected between its drain and body, as well as a small transistor 325a through 325n, respectively, connected between its body and source. Thus, stacked switch branch 350 may control voltages multiple times higher than those controllable with a single switch, such as single switch 300. Each of transistors 320a through 320n and 325a through 325n are preferably field effect transistors (FETs). However, the present application is not so limited, and each of transistors 320a through 320n and 325a through 325n may be any other type of suitable transistor.

Figure 4:
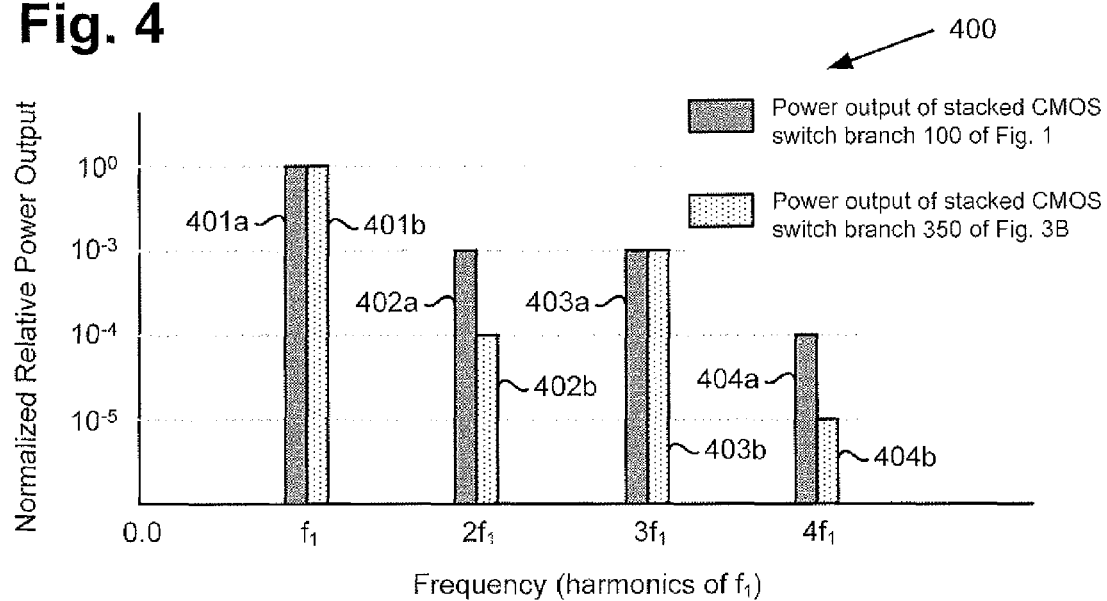
FIG. 4 illustrates an exemplary chart showing relative normalized power outputs of a stacked switch branch, according to one implementation of the present application.

FIG. 4 illustrates an exemplary chart showing relative normalized power outputs of a stacked switch branch, in accordance with one implementation of the present application. For example, chart 400 may show the power output of stacked switch branch 350 versus conventional stacked switch branch 100 at several harmonics of an input signal $f_1$. As stated previously, the present inventive concepts do not affect odd order harmonics but substantially attenuate even order harmonics of a signal input to said RF switch branch at the output of the RF switch branch as compared to the conventional design of FIG. 1A. Thus, power outputs 401a and 401b at first harmonic frequency $f_1$ are substantially equal for both stacked switch branch 100 and stacked switch branch 350, respectively, at a normalized value of 10°, or 1. This normalized value may correspond to an example power output at $f_1$ of approximately 0.5 W. Similarly, power outputs 403a and 403b at third harmonic frequency $3f_1$ are substantially equal for both conventional stacked switch branch 100 and stacked switch branch 350, respectively, having a normalized value of $10^{-3}$, or 1/1000 of the value at f1. This may correspond to an example power output at $3f_1$ of approximately 0.5 mW.

However, at $2f_1$ power output 402b for stacked switch branch 350 is substantially attenuated with respect to power output 402a of conventional stacked switch branch 100. For example, 402b may be approximately 10 times smaller than 402a for the same input power at $2f_1$. FIG. 4 shows 402a and 402b at normalized values of $10^{-3}$ and $10^{-4}$, or 1/1000 and 1/10,000 of the power output at $f_1$, respectively. This may correspond to an example power output at $2f_1$ of approximately 500 μW and 50 μW for power outputs 402a and 402b, respectively. Similarly, power output 404b for stacked switch branch 350 is substantially attenuated with respect to power output 404a of conventional stacked switch branch 100 at fourth harmonic frequency $4f_1$. For example, 404b may be approximately 10 times smaller than 404a for the same input power at $4f_1$. FIG. 4 shows 404a and 404b at normalized values of $10^{-4}$ and $10^{-5}$, 1/10,000 and 1/100,000 of the power output at $f_1$, respectively. This may correspond to an exemplary power output at $4f_1$ of approximately 50 μW and 5 μW for power outputs 404a and 404b, respectively. However, the above power output values are only illustrative. Thus, actual values may be greater or less than the above values, and may be of different proportions to one another than discussed above. Accordingly, the present application provides an RF switch branch achieving improved linearity by attenuating or eliminating even order harmonics through symmetrical body node biasing, without requiring expensive SOI manufacturing techniques.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the spirit and the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A radio frequency (RF) switch branch having a reduced nonlinearity, said RF switch branch comprising:
   a primary transistor;
   a first transistor having power terminals electrically connected between a drain node and a body node of said primary transistor;
   a second transistor having power terminals electrically connected between said body node and a source node of said primary transistor;
   wherein one of said power terminals of said first transistor and one of said power terminals of said second transistor are coupled to ground through a body resistor of said primary transistor;
   wherein a ratio between a body node-to-ground impedance of said primary transistor and either a drain-to-body impedance of said primary transistor or a source-to-body impedance of said primary transistor increases without increasing said body node-to-ground impedance when said primary transistor is ON.

2. The RF switch branch of claim 1, further comprising a body resistor electrically connected between said body node of said primary transistor and ground.

3. The RF switch branch of claim 1, further comprising a gate resistor electrically connected between a gate of said primary transistor and a gate voltage source.

4. The RF switch branch of claim 3, wherein a gate of each of said first transistor and said second transistor is electrically connected to said gate voltage source such that said first transistor and said second transistor are ON only when said primary transistor is ON.

5. The RF switch branch of claim 1, wherein said first transistor and said second transistor are configured to bias said body node of said primary transistor to a voltage substantially equal to a midpoint between a drain voltage and a source voltage of said primary transistor.

6. The RF switch branch of claim 1, wherein an area of each of said first transistor and said second transistor is substantially smaller than an area of said primary transistor.

7. The RF switch branch of claim 1, wherein said RF switch branch is configured to attenuate even order harmonics of a signal input to said RF switch branch, at an output of said RF switch branch when said primary transistor is ON.

8. The RF switch branch of claim 1, wherein said RF switch branch has an odd transfer function when said primary transistor is ON.

9. The RF switch branch of claim 1, wherein said primary transistor is a field effect transistor (FET).

10. The RF switch branch of claim 1, wherein said first transistor and said second transistor are field effect transistors (FETs).

11. A method for reducing nonlinearity in a radio frequency (RF) switch branch, said method comprising:
for a primary transistor within said RF switch branch:
biasing a body node of said primary transistor to a voltage substantially equal to a midpoint between a drain voltage and a source voltage of said primary transistor;
a first transistor having power terminals coupled between a drain node and a body node of said primary transistor;
a second transistor having power terminals coupled between said body node and a source node of said primary transistor;
wherein one of said power terminals of said first transistor and one of said power terminals of said second transistor are coupled to ground through a body resistor of said primary transistor;
wherein a ratio between a body node-to-ground impedance of said primary transistor and either a drain-to-body impedance of said primary transistor or a source-to-body impedance of said primary transistor increases without increasing said body node-to-ground impedance when said primary transistor is ON.

12. The method of claim 11, wherein said one of said power terminals of said first transistor is a drain terminal and said one of said power terminals of said second transistor is a source terminal.

13. The method of claim 11, wherein said first transistor and said second transistor are ON only when said primary transistor is ON.

14. The method of claim 11, wherein an area of each of said first transistor and said second transistor is substantially smaller than an area of said primary transistor.

15. The method of claim 11, wherein said biasing occurs when said primary transistor is ON.

16. The method of claim 11, further comprising attenuating even order harmonics of a signal input to said RF switch branch, at an output of said RF switch branch when said primary transistor is ON.

17. The method of claim 11, wherein said biasing increases said ratio between said body node-to-ground impedance of said primary transistor and said source-to-body impedance of said primary transistor when said primary transistor is ON.

18. The method of claim 11, wherein said biasing increases said ratio between said body node-to-ground impedance of said primary transistor and said drain-to-body impedance of said primary transistor when said primary transistor is ON.

19. The method of claim 11, wherein said primary transistor is a field effect transistor (FET).

20. The method of claim 11, wherein said first transistor and said second transistor are field effect transistors (FETs).

\* \* \* \* \*